United States Patent [19]
van de Grift et al.

[11] Patent Number: 4,686,508

[45] Date of Patent: Aug. 11, 1987

[54] ANALOG-TO-DIGITAL CONVERTER CIRCUIT

[75] Inventors: Robert E. J. van de Grift; Martien van der Veen, both of Eindhoven, Netherlands

[73] Assignee: U.S. Philips Corporation, New York, N.Y.

[21] Appl. No.: 903,046

[22] Filed: Sep. 2, 1986

[30] Foreign Application Priority Data

Sep. 13, 1985 [NL] Netherlands .......................... 8502510

[51] Int. Cl.$^4$ ............................................. H03M 1/36
[52] U.S. Cl. ............................................. 340/347 AD
[58] Field of Search ................................. 340/347 AD

[56] References Cited

PUBLICATIONS

Arbel, "IEEE Transactions on Nuclear Science", vol. NS-22, Feb. 1975, pp. 446–451.

Primary Examiner—Charles D. Miller
Attorney, Agent, or Firm—Thomas A. Briody; William J. Streeter; Gregory P. Gadson

[57] ABSTRACT

In an analog-to-digital converter circuit comprising a comparison circuit per tap of a potential divider. The comparison circuits are arranged in groups each controlling a respective differential amplifier. In a group only one output of each comparison circuit is connected to an output of the subsequent comparison circuit operating in the opposite sense and the odd outputs of the group of outputs thus obtained are connected via a first group of emitter followers to a first input of one of the differential amplifiers, while the even outputs are connected via a second group of emitter followers to a second input of this differential amplifier.

1 Claim, 2 Drawing Figures

ANALOG-TO-DIGITAL CONVERTER CIRCUIT

BACKGROUND OF THE INVENTION

The invention relates to an analog-to-digital converter circuit comprising a potential divider having taps each connected to a first input of a respective comparison circuit, of a plurality of comparison circuits second inputs of which are interconnected, a same number of branches of the potential divider each time constituting a group, while of consecutive groups of taps the tap having the same ordinal number is connected to the first input of a respective comparison circuit of a group of comparison circuits each having a pair of outputs operating in opposite senses with mutual connections between outputs operating in opposite senses of consecutive comparison circuits of said group.

An analog-to-digital converter circuit of the type described above is known from IEEE International Solid-State Circuits Conference, Digest of technical papers, February 1984, pages 294–295.

For each comparison circuit of a group, the two outputs are connected to the two outputs operating in opposite senses of the subsequent comparison circuit of said group. Such an analog-to-digital converter circuit is suitable for converting signals having a large bandwidth such as, for example, a video signal in which digital signal samples must be obtained at a high sampling frequency.

SUMMARY OF THE INVENTION

It is an object of the invention to provide an analog-to-digital converter circuit having improved properties.

To this end according to the invention an analog-to-digital converter circuit of the type described in the opening paragraph is characterized in that for each comparison circuit of a group, only one output is connected to only one output operating in the opposite direction of the subsequent comparison circuit of the group, while the odd outputs of the outputs of a group thus obtained are each connected to the base of a respective transistor of a first group of transistors having interconnected emitters which are connected to a first input of a differential amplifier, and the even outputs are each connected to the base of a respective transistor of a second group of transistors having interconnected emitters connected to a second input of the differential amplifier.

With this arrangement the capacitance per junction of the outputs of subsequent comparison circuits is reduced, and the total current of all comparison circuits per group is prevented from flowing through one and the same load resistor.

BRIEF DESCRIPTION OF THE DRAWINGS

The invention will now be described with reference to the drawings.

In the drawings.

DETAILED DESCRIPTION OF THE DRAWINGS

Figure 1:
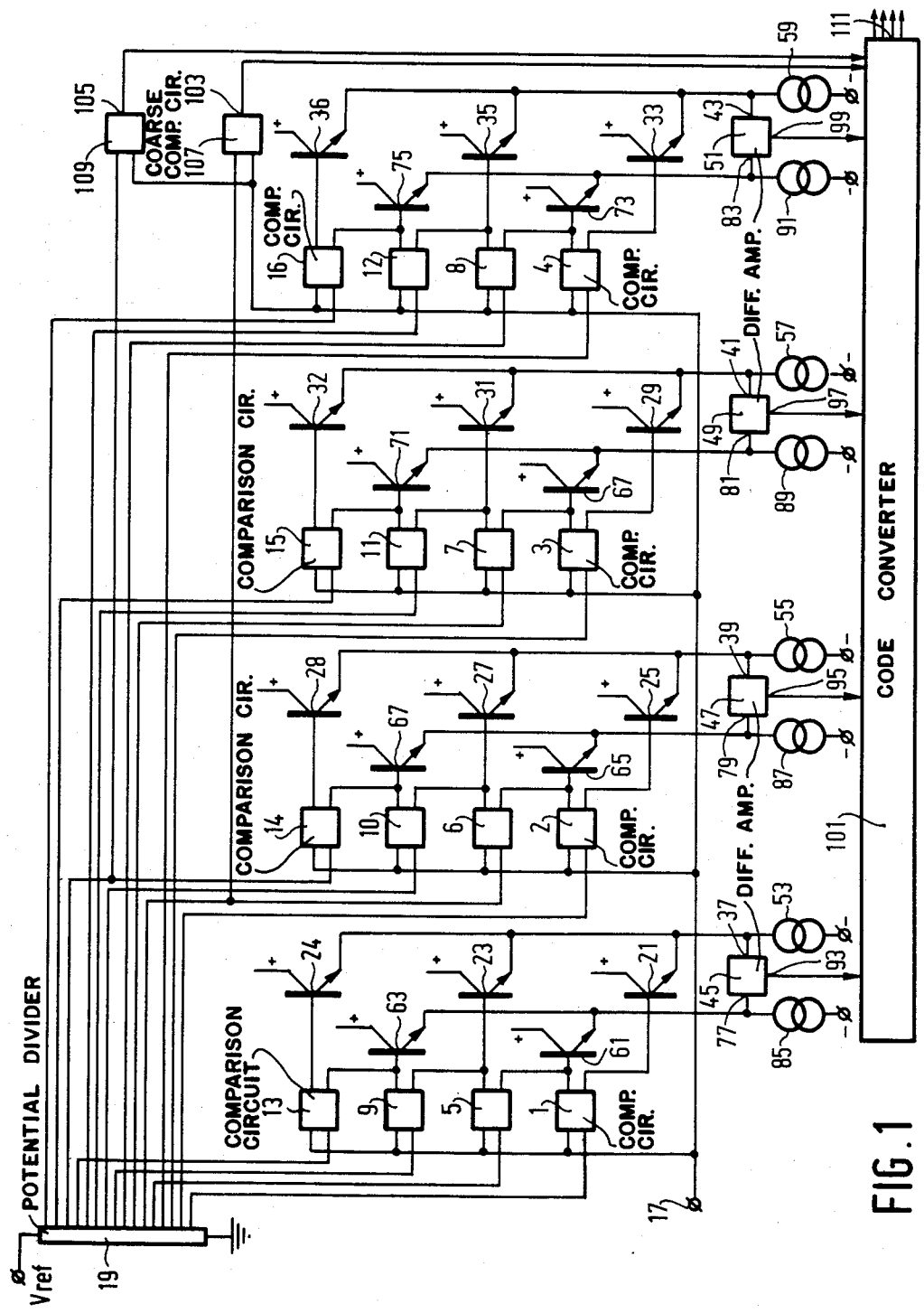
FIG. 1 shows by way of a concise block diagram a simplified analog-to-digital converter circuit according to the invention.

The analog-to-digital converter circuit of FIG. 1 has sixteen comparison circuits denoted by the reference numerals 1 through 16, the upper inputs of which are connected to an input 17 of the circuit to which a signal to be converted can be applied.

The lower input of each comparison circuit is connected to a tap of a potential divider 19 connected to a reference voltage $V_{ref}$, which tap corresponds in sequence to the numbering of the comparison circuits. There are four groups of four taps in this example, which has been kept simple for the sake of clarity. The first tap of consecutive groups of taps is connected to the lower input of the comparison circuits 1, 5, 9, 13 which constitute a first group. The second tap of the consecutive groups of taps is connected to the lower input of the comparison circuits 2, 6, 10, which constitute a second group. The third tap of the groups of taps is connected to the lower input of the consecutive comparison circuits 3, 7, 11, 15, which constitute a third group, and the fourth tap of the consecutive groups of taps is connected to the lower input of the comparison circuits 4, 8, 12, 16 which constitute a fourth group.

Each comparison circuit has an upper and a lower output which are operative in opposite senses, that is to say, when its upper input receives a higher potential than its lower input, its upper output will be high relative to its lower output, and conversely when its upper input receives a lower potential than its lower input, its lower output becomes high relative to its upper output. This applies if the outputs of the comparison circuit are not connected together in the manner to be described hereinafter.

In the first, second, third and fourth groups of comparison circuits 1, 5, 9, 13; 2, 6, 10, 14; 3, 7, 11 15 and 4, 8, 12, 16 the upper outputs of the comparison circuits 1, 5, 9 and 2, 6, 10; 3, 7, 11 and 4, 8, 12, respectively are connected to the lower outputs, operating in opposite senses of the subsequent comparison circuits 5, 9, 13 and 6, 10, 14; 7, 11, 15 and 8, 12, 16, respectively.

Per group of comparison circuits, there are five outputs the odd outputs, of which are connected to the base of a respective one of three transistors 21, 23, 24; and 25, 27, 28; 29, 31, 32 and 33, 35, 36, respectively, whose emitters are interconnected and are connected to first inputs 37, 39, 41 and 43 or differential amplifiers 45, 47, 49 and 51, respectively, and to current sources 53, 55, 57 and 59, respectively. The even outputs are connected to the base of a respective one of two transistors 61, 63; 65, 67; 69, 71 and 73, 75, respectively, whose emitters are interconnected and are connected to second inputs 77, 79, 81 and 83 of the differential amplifiers 45, 47, 49 and 51, respectively, and to current sources 85, 87, 89 and 91, respectively.

Outputs 93, 95, 97 and 99 of the differential amplifiers 45, 47, 49 and 51, respectively, are connected to a code converter 101 which converts the signals obtained from these outputs and from two outputs 103 and 105 of two coarse comparison circuits 107 and 109 into a four-bit code which is supplied from an output combination 111 of the code converter 101.

The coarse comparison circuits 107 and 109 detect levels being exceeded of the signal to be converted and applied to the lower inputs thereof, relative to the levels at the second tap in the second and fourth groups of taps, respectively, of the potential divider 19.

The code converter 101 may comprise further circuits as described in U.S. Pat. No. 4,456,904 (PHN 9925) in order to obtain faultless digital bit information from combinations of output signals from coarse and fine comparison circuits.

When the voltage at the input 17 of the circuit is varied from a minimum to a maximum convertable value, the output signals at the outputs 93, 95, 97 and 99 of the differential amplifiers 45, 47, 49 and 51, respectively, upon the levels at the consecutive branches of the potential divider 19 being successively exceeded by this voltage, will have a value as indicated in the following Table, and as will be further described hereinafter.

| Voltage at the input 17 | signal value at the outputs | | | |
|---|---|---|---|---|
| | 93 | 95 | 97 | 99 |
| zero | 0 | 0 | 0 | 0 |
| >tap 1 | 1 | 0 | 0 | 0 |
| >tap 2 | 1 | 1 | 0 | 0 |
| >tap 3 | 1 | 1 | 1 | 0 |
| >tap 4 | 1 | 1 | 1 | 1 |
| >tap 5 | 0 | 1 | 1 | 1 |
| >tap 6 | 0 | 0 | 1 | 1 |
| >tap 7 | 0 | 0 | 0 | 1 |
| >tap 8 | 0 | 0 | 0 | 0 |
| >tap 9 | 1 | 0 | 0 | 0 |
| >tap 10 | 1 | 1 | 0 | 0 |
| >tap 11 | 1 | 1 | 1 | 0 |
| >tap 12 | 1 | 1 | 1 | 1 |
| >tap 13 | 0 | 1 | 1 | 1 |
| >tap 14 | 0 | 0 | 1 | 1 |
| >tap 15 | 0 | 0 | 0 | 1 |
| >tap 16 | 0 | 0 | 0 | 0 |

From this Table it is apparent that eight different possible bit combinations can be obtained with four groups of comparison circuits which can thus supply three bits of the output signal of the code converter 101, while the fourth bit is obtained with the aid of the comparison circuits 107 and 109.

Consequently (n+1) fine bits can generally be obtained with $2^n$ groups of $2^m$ comparison circuits and a potential divider with $2^{2n}$ taps and (m−1) coarse bits must be made with the aid of coarse comparison circuits for which, for example, $2^{m-1}$ coarse comparison circuits can be used, where m and n are positive integers.

Figure 2:
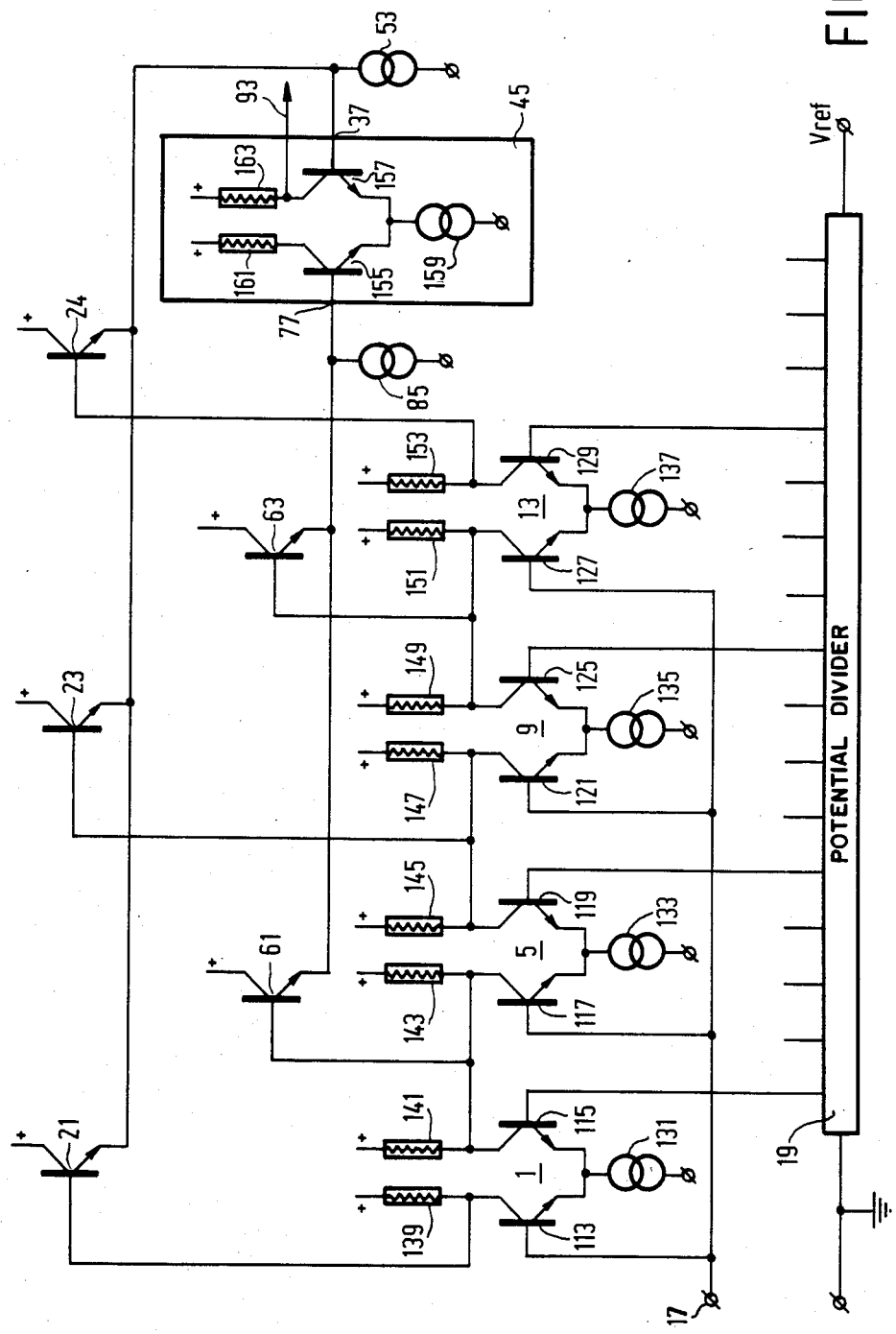
FIG. 2 shows by way of a principle circuit diagram, part of a simplified analog-to-digital converter circuit according to the invention.

The operation of a group of comparison circuits will now be described with reference to FIG. 2 in which corresponding components have the same reference numerals as in FIG. 1. The first group with the comparison circuits 1, 5, 9 and 13 has been chosen. Each comparison circuit comprises transistor pairs 113, 115; 117, 119; 121, 125 and 127, 129, respectively. The emitters of these pairs are connected to current sources 131, 133, 135 and 137, respectively. The collectors of the transistors 113, 115, 117, 119, 121, 125, 127 and 129 are connected via resistors 139, 141, 143, 145, 147, 151 and 153, respectively, to a positive voltage. All these resistors have the same value, except for the resistors 139 and 153 whose value is half that of the others.

The bases of the transistors 113, 117, 121 and 127 are connected to the signal input 17, and those of the transistors 115, 119, 125 and 129 are connected to the first, fifth, ninth and thirteenth taps, respectively, on the potential divider 19.

The collectors of the transistors 115 and 117 are connected together, likewise are those of the transistors 119 and 121 and those of the transistors 125 and 127.

The bases of the transistors 21, 23, 24, 61 and 63 are connected to the collectors of the transistors 139, 121, 129, 117 and 127, respectively.

The differential amplifier 45 has a transistor pair 155, 157 whose emitters are connected to a current source 159, whose collectors are connected via resistors 161, 163 to a positive voltage and whose bases are connected to the inputs 77 and 37 of the differential amplifier 45, the output 93 of which is connected to the collector of the transistor 157.

The collector resistors 139, 141, 143, 145, 147, 149, 151, 153 of the transistors 113, 115, 117, 119, 121, 125, 127, 129 have a high value such that the voltage at the relevant collectors, is low when the current from one of the current sources 131, 133, 135, 137 passes through them. When this current passes through the parallel circuit of the resistors 141 and 143, 145 and 147 or 149 and 151, the voltage at the relevant collectors is at a level between the low level and the supply voltage.

The emitters of the group of transistors 21, 23, 24 assume the highest level of the collectors connected to the bases. This also applies to the group of transistors 61, 63.

The voltage distribution at different points in the circuit will now be examined with reference to the following Table. The character H is used in this case for a supply voltage level and the character L is used for a low level.

| Input 17 = bases 113, 117, 121, 127 | Collector | | | | | Input | | Output |
|---|---|---|---|---|---|---|---|---|
| | 113 | 117 | 121 | 127 | 129 | 37 | 77 | 93 |
| <1st tap | H | L | L | L | L | H | L | L |
| >1st tap | L | H | L | L | L | L | H | H |
| >5th tap | L | L | H | L | L | H | L | L |
| >9th tap | L | L | L | H | L | L | H | H |
| >13th tap | L | L | L | L | H | H | L | L |

A similar Table can be set up for each of the other groups of comparison circuits in FIG. 1.

For the sake of clarity the parallel circuits of collector resistors 141 and 143, 145 and 147, 149 and 151 are shown as separate resistors, Generally, these will of course be replaced by a single resistor of half the value.

When a large number of comparison circuits is used for the coarse bits, they may of course be grouped in a corresponding manner and be connected as described above for the comparison circuits for the fine bits.

We claim:

1. An analog-to-digital converter circuit comprising a potential divider having taps each connected to a first input of a respective comparison circuit of a plurality of comparison circuits second inputs of which are interconnected, a same number of taps of the potential divider each time constituting a group, whilst of consecutive groups of taps the branch having the same ordinal number is connected to the first input of a respective comparison circuit of a group of comparison circuits each having a pair of outputs operating in opposite senses with mutual connections between outputs operating in opposite senses of consecutive comparison circuits of said group, characterized in that of each comparison circuit (15, 9, 13) of a group only one output (collectors of 115, 119, 125 respectively) is connected to only one output (collectors of 117, 121, 127, respectively) operating in the opposite sense of the subsequent comparison circuit of the group, whilst the odd outputs (collectors of 113, 119, 121, 129) of the outputs of a group thus obtained are each connected to the base of a respective transistor of a first group of transistors (21, 23, 24) having interconnected emitters which are connected to a first input (37) of a differential amplifier (45) and the even outputs (collectors of 115, 117, 125, 127) are each connected to the base of a respective transistor of a second group of transistors (61, 63) having interconnected emitters connected to a second input (77) of the differential amplifier (45).

* * * * *